United States Patent [19]

Fukuda

[11] Patent Number: 4,497,665
[45] Date of Patent: Feb. 5, 1985

[54] METHOD FOR MANUFACTURING SEMICONDUCTOR DEVICE

[75] Inventor: Takeshi Fukuda, Kawasaki, Japan

[73] Assignee: Fujitsu Limited, Kawasaki, Japan

[21] Appl. No.: 455,327

[22] Filed: Jan. 3, 1983

Related U.S. Application Data

[62] Division of Ser. No. 244,952, Mar. 18, 1981, Pat. No. 4,409,609.

[30] Foreign Application Priority Data

Mar. 25, 1980 [JP] Japan ................... 55-38070

[51] Int. Cl.³ ................. H01L 21/76; H01L 21/308
[52] U.S. Cl. ................. 148/1.5; 29/576 E; 29/576 W; 29/576 T; 29/577 C; 29/578; 29/580; 148/174; 148/175; 156/647; 156/649
[58] Field of Search ........... 148/1.5, 174, 175; 29/576 E, 576 W, 576 T, 577 C, 578, 580; 156/647, 649; 357/40, 49, 50, 55, 59, 65, 91

[56] References Cited

U.S. PATENT DOCUMENTS

| | | | |
|---|---|---|---|
| 3,956,033 | 5/1976 | Roberson | 148/175 |
| 4,037,306 | 7/1977 | Gutteridge et al. | 29/578 X |
| 4,048,649 | 9/1977 | Bohn | 357/59 X |
| 4,214,918 | 7/1980 | Gat et al. | 148/1.5 |
| 4,233,091 | 11/1980 | Kawabe | 29/576 W |
| 4,260,436 | 4/1981 | Taylor | 29/580 X |
| 4,269,636 | 5/1981 | Rivoli et al. | 148/175 |
| 4,295,924 | 10/1981 | Garnache et al. | 156/647 X |
| 4,420,874 | 12/1983 | Funatsu | 29/576 W |

FOREIGN PATENT DOCUMENTS

| | | |
|---|---|---|
| 0030286 | 6/1981 | European Pat. Off. |
| 2837800 | 3/1980 | Fed. Rep. of Germany |

OTHER PUBLICATIONS

Applied Physics Letters, vol. 34, No. 11, Jun. 1979, pp. 737-739, New York, USA, C. P. Wu et al.

Primary Examiner—W. G. Saba
Attorney, Agent, or Firm—Staas & Halsey

[57] ABSTRACT

In a method of fabricating a semiconductor device having a V-groove insulating isolation structure with polycrystalline silicon filled in the groove of which the internal surface is covered with an insulating film of silicon dioxide, the method according to this invention comprises the steps of selectively ion implanting an impurity material into a desired region of the polycrystalline silicon layer in order to give to this region a desired different type of electric conductivity relative to the polycrystalline silicon layer followed by a selective annealing by an energy beam such as a laser of a desired part of the polycrystalline silicon layer including the region into which the impurity material has been ion implanted.

6 Claims, 14 Drawing Figures 4,497,665

METHOD FOR MANUFACTURING SEMICONDUCTOR DEVICE

This is a division, of application Ser. No. 244,952 filed Mar. 18, 1981 now U.S. Pat. No. 4,409,609.

BACKGROUND OF THE INVENTION

This invention is directed to a semiconductor device and a method of manufacturing a semiconductor device, and more particularly, to a method of forming an insulating isolation layer in a semiconductor device.

In the manufacture of bipolar semiconductor integrated circuit devices, efforts have been made in the fabrication of isolation layers or regions in various devices to increase the density of the integrated circuits by adopting an insulating isolation of V-groove structure which has the merits of decreasing the area which is exclusively occupied by the isolation layer prepared in accordance with the known art and of a eliminating adverse effects in the performance of devices where the isolation layer and the functional layer of the device are arranged close to each other.

An example of the known insulating isolation layer of the V-groove structure is shown in cross-sectional view in FIG. 1. In a silicon substrate of a two layer structure comprising an n-type silicon epitaxial layer 2 formed on a p-type silicon substrate 1, there is formed the V-groove 4 with its surface covered with a silicon dioxide ($SiO_2$) film 3 penetrating through the n-type silicon layer 2 into the p-type silicon substrate 1. High purity polycrystalline silicon having a high specific resistance is filled into the V-groove, and a thick silicon dioxide ($SiO_2$) film 3' which is usually 5 to 6 $\mu$m wide is formed on the protruding surface of polycrystalline silicon 5. An insulating film 6 is formed on the surface of the n-type silicon layer 2.

Although this known insulating layer is formed of polycrystalline silicon 1 the layer has been used only for the purpose of insulating isolation and for no other purposes whatever. Attempts were made to confer electric conductivity to the polycrystalline silicon in the V-groove which occupies considerable area of the substrate and to utilize the insulating isolation layer as part of the wiring layers interconnecting the electrodes with a view to further increasing the integration density.

However, in various methods proposed to fill the V-groove 4 of the structure as shown in FIG. 1, of which the internal surface is covered with the $SiO_2$ film 3, with an n-type or p-type electrically conductive polycrystalline silicon by means of chemical vapor-phase deposition (CVD), many technical problems had to be coped with due to the facts the the electrically conductive polycrystalline silicon in the V-groove runs continuously throughout the entire surface of the substrate, that the specific resistance of the polycrystalline silicon layer cannot be made so low, that the isolation of devices beramis incomplete when a high electric potential is applied to the polycrystalline silicon layer due to the formation of a channel in the metal-oxide-semiconductor (MOS) fashion in the p-type silicon substrate around the edge of the V-groove, and the fact that $SiO_2$ film interposed between the polycrystalline silicon layer and the silicon layer of the substrate is relatively thin. An attempt to positively utilize the insulating isolation layer as a wiring layer interconnecting the electrodes has not been practiced in manufacturing bipolar integrated circuit devices.

SUMMARY OF THE INVENTION

In the present invention, the problems enumerated above have been fully reviewed, and a semiconductor device and a method of manufacturing the same are offered for forming a wiring layer for connecting the electrodes from a polycrystalline silicon layer in a restricted and desired region in an insulating isolation layer of the V-groove structure, with such wiring layer exhibiting excellent performance in the insulation of devices and also having a very high electric conductivity with a view to improving integration density of the semiconductor device further. An embodiment of the semiconductor device according to the present invention comprises:

a semiconductor substrate of a first conductive type, a semiconductor layer of a second conductive type opposite to the first conductive type, the layer being formed on the substrate, a V-groove penetrating through the semiconductor layer and reaching into the substrate, an insulating film formed on the surface of the V-groove, a polycrystalline semiconductor layer formed in the V-groove on the insulating film, a single-crystal semiconductor region formed at a surface portion of the polycrystal semiconductor layer for forming an interconnecting path between devices formed in the semiconductor layer, and a metal wiring layer formed in contact with the-single-crystal semiconductor region. In the semiconductor device of the above embodiment, said polycrystalline semiconductor layer preferably has a high specific resistance. Furthermore, in the semiconductor device of the above embodiment, said single-crystal semiconductor region preferably has a first region of one conductive type and a second region of the other conductive type to form a PN junction therebetween, the first region being formed in the second region and forming said interconnecting path, the second region electrically isolating the first region from the polycrystalline silicon layer. An embodiment of a method of manufacturing a semiconductor device according to the present invention comprises the steps of:

preparing a semiconductor substrate of a first conductive type having a semiconductor layer of a second conductive type opposite to the first conductive type, the layer being formed on the substrate, forming a V-groove penetrating through the semiconductor layer and reaching into the substrate, forming an insulating film on the surface of the V-groove, forming a polycrystalline semiconductor layer on the insulating film in the V-groove, and irradiating an energy beam onto a surface portion of the polycrystalline semiconductor layer to convert the portion to a single-crystal region for an interconnecting path between devices to be formed in the semiconductor layer. In the method of manufacturing a semiconductor device of the above embodiment, said energy beam may be a laser beam. Preferably, the above method further comprises the step of implanting impurity ions into the polycrystalline semiconductor layer at said surface portion before the step of irradiating the energy beam.

A specific embodiment of the method of manufacturing a semiconductor device according to the invention thus comprises the steps of:

- forming an isolating layer of the V-groove structure which electrically isolates the devices from each other in a semiconductor substrate having a first semiconductor layer of one conductive type with a principal plane of Miller indices (100) and a second semiconductor layer with a principal plane of Miller indices (100) on the first semiconductor layer of a conductive type different from that of the first semiconductor layer, the V-groove penetrating through the second semiconductor layer and reaching into the first semiconductor layer,
- forming an insulating film on the internal surface of the V-groove,
- forming a polycrystalline silicon layer of high purity or of a desired electric conductivity type on the semiconductor substrate in such a manner that the polycrystalline silicon fills the V-groove and covers the entire surface of the substrate,
- removing the polycrystalline silicon layer from the surface of the substrate such that polycrystalline silicon remains only in the V-groove,
- selectively doping an impurity material into a layer of polycrystalline silicon of high purity in the V-groove to render the desired region p-type or n-type in electric conductivity, or doping impurity material of the opposite conductivity type into the layer of polycrystal silicon in the V-groove of a second conductivity type, to give to the desired region an electric conductivity type which is different from that polycrystalline silicon layer of the, and
- selectively annealing the polycrystalline silicon layer of the layer including the desired region into which the impurity material has been implanted.

Another embodiment of the method of manufacturing the semiconductor device according to the invention is characterized by the steps of:

- filling the V-groove with polycrystalline silicon of a first conductivity type to form a polycrystalline silicon layer,
- forming in the polycrystalline silicon layer a region of a second conductivity type which is different from the first conductivity type, and
- annealing by a laser beam to turn a desired region of the polycrystalline silicon layer including the region of the second conductivity type into a single-crystal silicon region,
- thereby to form a junction between the first and second conductivity type regions in the single-crystal silicon region, the region of the second conductivity type interconnecting electrodes of the devices.

A further embodiment of the method of the invention is characterized by the fact that, after removal of the polycrystalline silicon layer from the surface of the substrate, leaving it only in the V-groove as described in the first embodiment of the invention, dopant material such as boron is ion implanted into the polycrystalline silicon layer in the V-groove to form a shallow p-type polycrystalline silicon layer.

The above and further objects and novel features of the invention will appear more fully from the following detailed description when read in connection with the accompanying drawings. It is to be expressly understood, however, that the drawings are not intended as a definition of the invention but are for the purpose of illustration only.

BRIEF DESCRIPTION OF THE DRAWINGS

In the drawings wherein like parts are marked alike.

DETAILED DESCRIPTION OF THE PREFERRED EMBODIMENT

Reference will first be made to FIGS. 2A to 2J which show in cross-section the steps to carry out one embodiment of the method of the invention.

Figure 1:
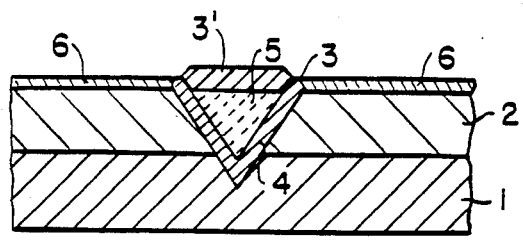
FIG. 1 is a cross-sectional view of an insulation isolation layer of a V-groove structure according to the prior art, FIGS. 2A to 2J inclusive are cross-sectional views illustrating the steps to carry out the method of the invention, and FIGS. 3A to 3C inclusive are cross-sectional views showing the steps to carry out an other embodiment of the method of the invention.
Figure 2D:
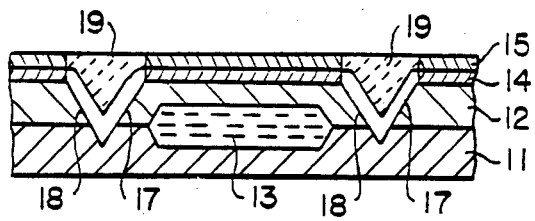
Figure 2A:
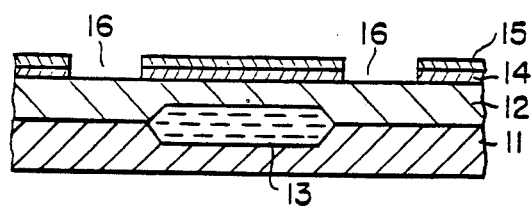

In carrying out the method of the invention, an n-type silicon layer 12 is epitaxially grown, 2 to 3 $\mu$m thick, on a p-type silicon substrate 11 with a principal surface of which the Miller indices are (100) as shown in FIG. 2A, and at desired regions at the bottom of the n-type silicon layer 12, there are provided a plurality of n+-type silicon buried layers 13 of square or rectangular shape each with its two sides in the direction of [110] and [110]. All of these steps are conventional, and the silicon substrate thus formed is conventionally utilized to fabricate bipolar integrated circuits.

A first silicon dioxide ($SiO_2$) film 14 approximately 1,000 Å thick is formed on the substrate by the known thermal oxidation process for example, and on this first $SiO_2$ film 14, a first silicon nitride ($Si_3N_4$) film 15 approximately 2,500 Å thick is grown by the conventional chemical vapor-phase deposition for example. Using such a known process as photolithographic etching, a window 16 is formed as illustrated in FIG. 2A in the first $Si_3N_4$ film 15 and the first $SiO_2$ film 14 located under the film 15 for the purpose of subsequently forming a V-groove approximately 6 to 7 $\mu$m wide which will surround the upper region of each buried layer 13 in the [110] and [110] directions.

These steps are followed by anisotropic etching of the silicon layer exposed through the window 16 for forming the V-groove using an anisotropic etchant containing potassium hydroxide (KOH), for example. Thusly is formed in the substrate at the periphery of the buried layer 13 a V-groove 17 penetrating through the n-type silicon layer 12 and reaching into the p-type silicon substrate 11 as illustrated in FIG. 2B.

Figure 2E:
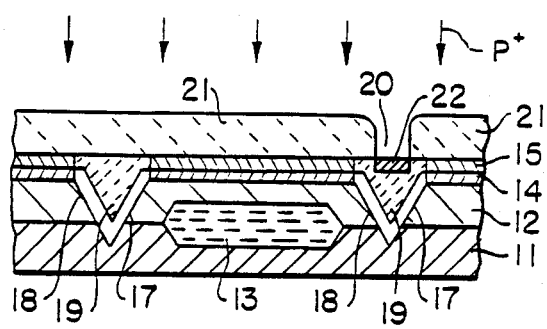
Figure 2B:
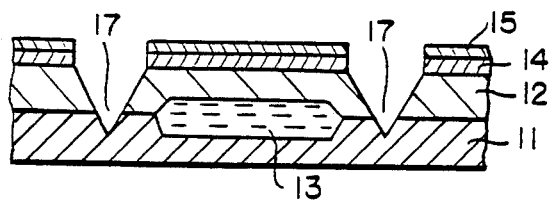
Figure 2F:
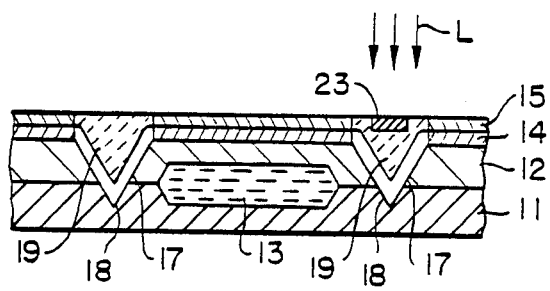
Figure 2C:
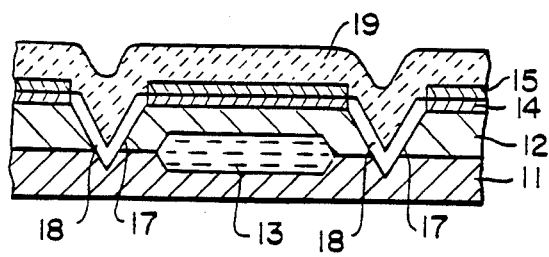

Next, as depicted in FIG. 2C, a second silicon dioxide ($SiO_2$) film 18 approximately 0.5 $\mu$m thick is formed by a known process on the internal surface of the V-groove 17. Thereafter, a high purity polycrystalline silicon layer 19 approximately 6 to 7 $\mu$m thick is grown on the surface of the substrate by the conventional chemical vapor-phase deposition such that the V-groove 17 is completely filled with polycrystalline silicon.

The substrate is then lapped by a known process to remove polycrystalline silicon layer 19 deposited on the substrate and also, as shown in FIG. 2D, to expose the $Si_3N_4$ film 15 under the layer of polycrystalline silicon. Throughout these steps, polycrystalline silicon layer 19 still remains in the V-groove 17.

Further, a photoresist layer 21 is coated and patterned as depicted in FIG. 2E to provide a window 20 for the purpose of subsequently forming an electrically conductive layer of a desired shape. Ions of phosphorous (P+) are ion implanted, with a dosage of $1 \times 10^{15}$ cm$^{-2}$ under energy of 60 Kev, the photoresist layer 21 being used as a mask to form in the polycrystalline silicon layer 19 in the V-groove 17 an ion implanted layer 22 of n+-type of a desired shape having the depth of approximately 0.15 μm.

Then, the photoresist layer 21 on the substrate is removed using a conventional technique, and as illustrated in FIG. 2F, a Q switched ruby laser beam L having a power density of $10^7$ to $10^8$ w/cm$^2$ is irradiated onto the ion implanted layer 22 for a short period of time, typically 20 to 50 ns, to anneal the layer 22 according to a given pattern to fabricate an n+-type single-crystal silicon conductive layer 23. Thereafter, in order to ensure the insulation of the surfaces of the conductive layer 23 and polycrystalline silicon layer 19, it is desired that a fourth SiO$_2$ film 28 (FIG. 2H) which is about 1 μm thick be formed by conventional thermal oxidation of the surface of the polycrystalline silicon layer 19 including the conductive layer 23. As will be understood by those skilled in the art, it is not easy to form in such a thick SiO$_2$ film a window for contact to the conductive layer 23 at a later step in the process. Therfore, the processes subsequent to the completion of the conductive layer 23 will be carried out in a manner to be described below.

Figure 2G:
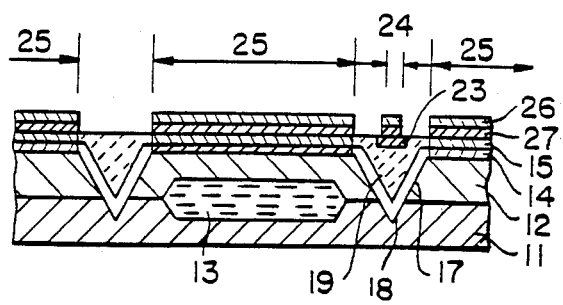

Employing a conventional chemical vapor-phase deposition technique, there is grown on the substrate a third SiO$_2$ film 27 approximately 1,000 Å thick and a second Si$_3$N$_4$ film 26, also approximately 1,000 Å thick. These films are patterned according to a conventional method, and as shown in FIG. 2G an oxidation resisting mask layer is formed on a region 24 where a window is to be formed for an electrode contact to the conductive layer being 23, the mask layer comprised of the third SiO$_2$ film 27 and the second Si$_3$N$_4$ film 26 thereon. Throughout the process just described, the oxidation resisting mask layer remains on the region 25 of the substrate where devices are to be fabricated.

Figure 2H:
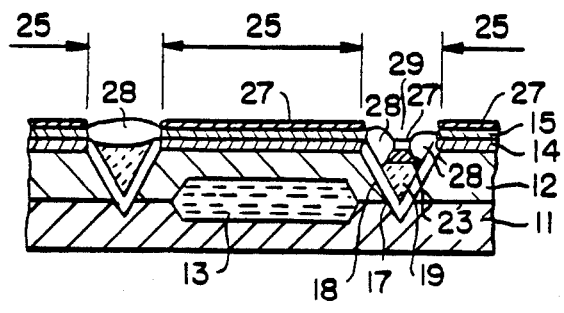

Then, the substrate undergoes a conventional thermal oxidation to form a fourth SiO$_2$ film 28 approximately 1 μm thick on the portions of the conductive layer 23 and of the polycrystalline silicon layer 19 which were not covered by the oxidation resisting mask layer as illustrated in FIG. 2H. Subsequent to this, the second Si$_3$N$_4$ film 26 is removed and a window 29 for the contact to the conductive layer is formed through the thick fourth SiO$_2$ film 28 on the conductive layer 23, the thin third SiO$_2$ film 27 being left at the bottom. During the above-described process, there remains the third SiO$_2$ film 27 on the first Si$_3$N$_4$ film 15 on the region 25 where devices are to be fabricated.

Figure 2I:
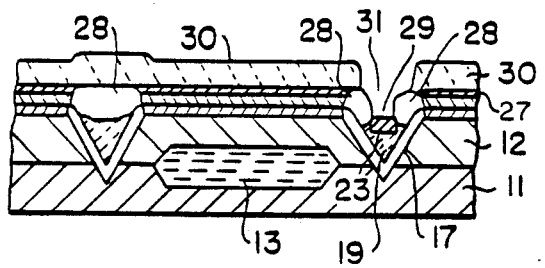

Thereafter, devices such as transistors (not shown) are fabricated in the epitaxial layer at the region 25 according to a conventional method, and as depicted in FIG. 2I, the substrate is coated with an insulation layer 30 of phosphosilicate-glass (PSG) for example. Utilizing a conventional technique further, a window 31 for a wiring connection to the conductive layer 23 formed in the polycrystalline layer 19 in V-groove 17 for an interconnecting path between electrodes of the devices is formed simultaneously with the opening of windows (not shown) for other electrode contact to each functional layer of the semiconductor devices fabricated through insulating protective layers 30, 27, 15 and 14.

Figure 2J:
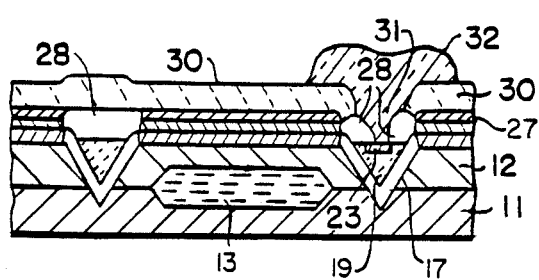

Then, as illustrated in FIG. 2J, a metal wiring layer 32 of aluminum for example is fabricated in contact with the conductive layer 23 in the contact window 31 in a manner known in the art.

An electrically conductive layer or wiring layer for interconnecting the electrodes of the devices in a V-groove isolation region prepared in accordance with the method described above is formed of single-crystal silicon doped with impurity material, so that its electric resistance is extremely low. Further, since this conductive layer is isolated from the region of the semiconductive devices by the SiO$_2$ film formed on the internal surface of the V-groove and the thick high purity polycrystalline silicon layer deposited in the V-groove, it shows excellent insulation characteristics and dielectric strength vis-a-vis the regions of the devices. Furthermore, isolation defects due to a parasitic MOS effect experienced with the conventional V-groove structure are effectively prevented by the existence of the high resistivity polycrystalline silicon layer at the bottom of the V-groove according to the invention.

In the foregoing description of one embodiment of the invention, high purity polycrystalline silicon having a high value of resistance is filled in the V-groove, then an electrically conductive layer is formed in the polycrystalline silicon layer at the surface thereof. In a second embodiment of the invention, however, a polycrystalline silicon layer of a first conductivity type is employed to fill the V-groove, and in a desired region of the polycrystalline silicon layer of the first conductivity type, a polycrystalline silicon region of a second conductivity type different from the first conductivity type is formed by means of ion implantation. Laser annealing is then carried out to turn a desired region of the first polycrystalline silicon layer including the second polycrystal silicon layer into a single-crystal silicon structure. By this annealing step a pn-junction is formed in the single-crystal silicon layer between the region of the first conductivity type which is the same as that of the polycrystalline silicon layer in the V-groove and a conductivity layer or wiring layer for inter-connecting the electrodes of the devices is formed by the single-crystal silicon layer of the second conductive type. A high resistance value of the pn-junction in the reverse direction is utilized to ensure a high degree of insulation between the conductive layer or the wiring layer for connecting the electrodes and the regions of the devices and to prevent the parasitic MOS transistor action at the bottom of the V-groove.

In a third embodiment of the invention, the steps explained above by reference to FIGS. 2A to 2D are carried out in exactly the same manner.

Figure 3A:
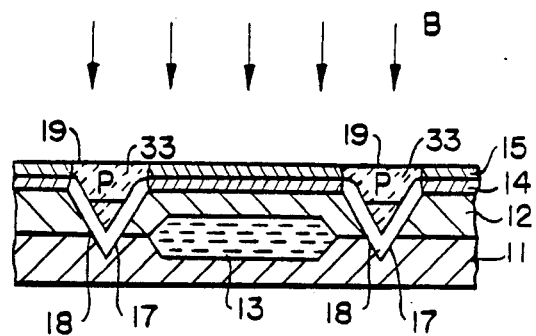

Then, as illustrated in FIG. 3A, dopant material, boron for example, is ion implanted by a conventional method into the polycrystalline silicon layer 19 in the V-groove to form a shallow p-type polycrystalline silicon layer 33.

Figure 3B:
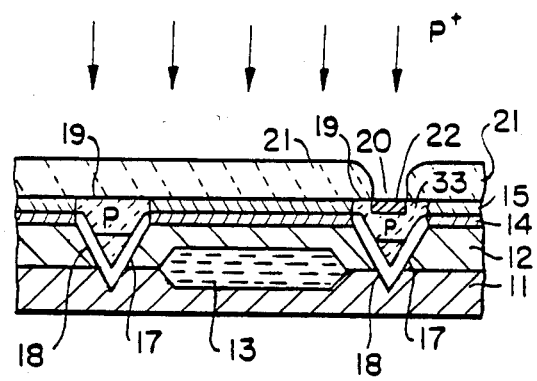

Thereafter, a photoresist is coated and patterned as shown in FIG. 3B in the same manner as was explained referring to FIG. 2E to provide a window 20. Ions of phosphorus (P+) are implanted with a dosage of $1 \times 10^{15}$ cm$^{-2}$ under an accelerating energy of 60 KeV, using the photoresist layer 21 as a mask to form in the polycrystal silicon layer 19 in the V-groove 17 an ion implanted layer 22 of n+-type of a desired shape and having a depth of approximately 0.15 μm.

Figure 3C:
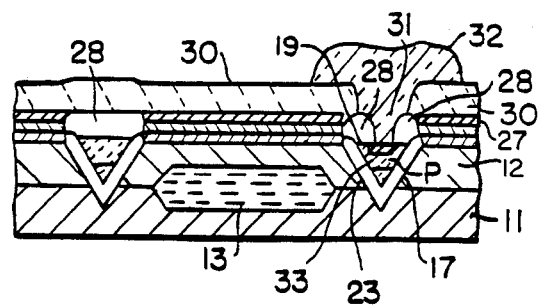

These steps are followed by those explained before referring to FIGS. 2F to 2I. After a metal wiring layer 32 of aluminum for example is fabricated in the contact window 31 in a conventional manner, the structure as illustrated in FIG. 3C is prepared.

In the foregoing description of the methods of the invention, a laser beam was used for annealing the layer implanted with ions of impurity material. As is apparent to a person skilled in the art, an electron beam may be also be utilized for the annealing to attain the same result.

As will be understood from the description of the preferred embodiments of the invention, it is possible by the methods of the invention to form, at a surface portion of the V-groove for isolation of the region of the devices, a wiring layer for interconnection of electrodes of low electric resistance without impairing the isolation characteristics of the V-groove between the devices. This will contribute to increasing integration density of the integrated circuits such as bipolar integrated circuits.

I claim:

1. A method of manufacturing interconnections for a plurality of semiconductor devices on a substrate, comprising the steps of:

preparing said semiconductor substrate to have a first conductivity type and a semiconductor layer of a second conductivity type opposite to the first conductivity type, the layer being formed on the substrate, forming V-grooves penetrating through the semiconductor layer and reaching into the substrate for selectively separating said devices, forming an insulating film on the surface of the V-groove, forming a polycrystalline semiconductor layer on the insulating film in the V-grooves so as to substantially fill said V-grooves, and irradiating an energy beam onto selected surface portions of the polycrystalline semiconductor layer along said V-grooves to convert said selected portion to single-crystal semiconductor for forming said interconnections.

2. The method of the claim 1, wherein said energy beam is a laser beam.

3. The method of claim 1 further comprising the step of implanting impurity ions into the polycrystalline semiconductor layer at said selected surface portions before the step of irradiating the energy beam.

4. The method of claim 1, 2 or 3, comprising forming said single-crystal semiconductor to comprise a region of a first conductivity type in contact with said polycrystalline layer, and a further region of second conductivity type within said region of first conductivity type.

5. The method of claim 1, comprising forming insulating regions at the surface of said polycrystal semiconductor layer on both sides of said single-crystal semiconductor for insulating said devices.

6. The method of claim 4, comprising forming insulating regions at the surface of said polycrystal semiconductor layer on both sides of said single-crystal semiconductor for insulating said devices.

* * * * *

UNITED STATES PATENT AND TRADEMARK OFFICE
CERTIFICATE OF CORRECTION

PATENT NO. : 4,497,665
DATED : 5 Feb. 1985
INVENTOR(S) : Fukuda

It is certified that error appears in the above-identified patent and that said Letters Patent is hereby corrected as shown below:

IN THE ABSTRACT:
Line 10, "layer" should be --layer,--.

Col. 1, line 17, after "of" insert --a--;
line 20, delete "a";
line 39, "1" should be --,--;
line 53, "the" (first occurrence) should be --that--;
line 57, delete --,--;
line 58, "beramis" should be --becomes--.

Col. 3, line 29, "the opposite" should be --a first--; "the" (second occurrence) should be --a desired region in a--;
line 34, delete "of the".

Col. 4, line 13, "an other" should be --another--;
line 28 "[110]" should be [$\bar{1}$10]--;
line 29 "[110]" should be --[1$\bar{1}$0]--;
line 44 "[110] and [110]" should be --[$\bar{1}$10] and [1$\bar{1}$0]--;
line 52, "11" should be --11,--;
line 65, after "steps," insert --the--.

Col. 5, line 38, "layer being 23" should be --layer 23--
line 38, "layer comprised" should be --layer being comprised --.

UNITED STATES PATENT AND TRADEMARK OFFICE
CERTIFICATE OF CORRECTION

PATENT NO. : 4,497,665

DATED : 5 Feb. 1985

INVENTOR(S) : Fukuda

It is certified that error appears in the above-identified patent and that said Letters Patent is hereby corrected as shown below:

Col. 6, line 47, "devices" should be --devices,--.

Col. 7, delete "be".

Signed and Sealed this

Third Day of September 1985

[SEAL]

Attest:

DONALD J. QUIGG

Attesting Officer     Acting Commissioner of Patents and Trademarks - Designate